US012610826B2

(12) United States Patent
Cao et al.

(10) Patent No.: US 12,610,826 B2
(45) Date of Patent: Apr. 21, 2026

(54) WAFER-LEVEL CHIP STRUCTURE, MULTIPLE-CHIP STACKED AND INTERCONNECTED STRUCTURE AND FABRICATING METHOD THEREOF

(71) Applicants:SHANGHAI XIANFANG SEMICONDUCTOR CO., LTD., Shanghai (CN); NATIONAL CENTER FOR ADVANCED PACKAGING CO., LTD., Wuxi (CN)

(72) Inventors: Liqiang Cao, Wuxi (CN); Yangyang Yan, Wuxi (CN); Peng Sun, Wuxi (CN); Tianfang Chen, Wuxi (CN); Fengwei Dai, Wuxi (CN)

(73) Assignees: SHANGHAI XIANFANG SEMICONDUCTOR CO., LTD., Shanghai (CN); NATIONAL CENTER FOR ADVANCED PACKAGING CO., LTD., Wuxi (CN)

( * ) Notice: Subject to any disclaimer, the term of this patent is extended or adjusted under 35 U.S.C. 154(b) by 767 days.

(21) Appl. No.: 17/908,118

(22) PCT Filed: Mar. 5, 2021

(86) PCT No.: PCT/CN2021/079317
§ 371 (c)(1),
(2) Date: Aug. 30, 2022

(87) PCT Pub. No.: WO2021/232891
PCT Pub. Date: Nov. 25, 2021

(65) Prior Publication Data
US 2023/0091513 A1 Mar. 23, 2023

(30) Foreign Application Priority Data
May 19, 2020 (CN) .......................... 202010426007.5

(51) Int. Cl.
*H10W 44/00* (2026.01)
*H10W 20/00* (2026.01)
(Continued)

(52) U.S. Cl.
CPC ......... *H10W 44/00* (2026.01); *H10W 20/023* (2026.01); *H10W 20/0245* (2026.01);
(Continued)

(58) Field of Classification Search
CPC ....... H01L 25/0657; H01L 2224/32145; H01L 2224/16145; H01L 23/481;
(Continued)

(56) References Cited

U.S. PATENT DOCUMENTS 7,843,052 B1 * 11/2010 Yoo ..................... H01L 25/0657
257/E23.141
10,147,682 B2 12/2018 Kao et al.
(Continued)

FOREIGN PATENT DOCUMENTS

CN 102270603 A 12/2011
CN 104253082 A 12/2014
(Continued)

OTHER PUBLICATIONS

Machine translation of KR-20170094026-A (Year: 2017).*
(Continued)

*Primary Examiner* — Ratisha Mehta
*Assistant Examiner* — Adam Joseph Mott
(74) *Attorney, Agent, or Firm* — Maschoff Brennan

(57) ABSTRACT
A wafer-level chip structure, a multiple-chip stacked and interconnected structure and a fabricating method thereof, wherein the wafer-level chip structure includes: a through-silicon via, which penetrates a wafer; a first surface including an active region, a multi-layered redistribution layer and a bump; and a second surface including an insulation
(Continued)

dielectric layer, and a frustum transition structure connected with the through-silicon via. In an embodiment of the present application, a frustum type impedance transition structure is introduced into a position between a TSV exposed area on a backside of a wafer and a UBM so as to implement an impedance matching between TSV and UBM, thereby alleviating the problem of signal distortion that is caused by an abrupt change of impedance.

7 Claims, 8 Drawing Sheets

(51) Int. Cl.

| | |
|---|---|
| *H10W 20/20* | (2026.01) |
| *H10W 72/00* | (2026.01) |
| *H10W 72/20* | (2026.01) |
| *H10W 72/30* | (2026.01) |
| *H10W 74/01* | (2026.01) |
| *H10W 74/10* | (2026.01) |
| *H10W 74/15* | (2026.01) |
| *H10W 90/00* | (2026.01) |
| *H10W 90/20* | (2026.01) |

(52) U.S. Cl.
CPC ....... *H10W 20/0249* (2026.01); *H10W 20/20* (2026.01); *H10W 72/019* (2026.01); *H10W 72/20* (2026.01); *H10W 74/012* (2026.01); *H10W 74/014* (2026.01); *H10W 74/016* (2026.01); *H10W 74/121* (2026.01); *H10W 74/15* (2026.01); *H10W 90/00* (2026.01); *H10W 90/20* (2026.01); *H10W 90/297* (2026.01); *H10W 90/722* (2026.01); *H10W 90/732* (2026.01); *H10W 72/0198* (2026.01); *H10W 72/07252* (2026.01); *H10W 72/07332* (2026.01); *H10W 72/07352* (2026.01); *H10W 72/221* (2026.01); *H10W 72/321* (2026.01); *H10W 90/291* (2026.01)

(58) Field of Classification Search
CPC ........... H01L 2225/06541; H01L 24/16; H01L 2224/16148; H01L 2224/73204; H01L 2225/06513; H01L 24/13; H01L 2225/06517; H01L 2225/06586; H01L 24/32; H01L 24/83; H01L 2225/06524; H01L 21/563; H01L 21/565
See application file for complete search history.

(56) References Cited

U.S. PATENT DOCUMENTS

| | | | | |
|---|---|---|---|---|
| 10,163,864 | B1 * | 12/2018 | England ................... | H10P 72/74 |
| 2006/0278979 | A1 * | 12/2006 | Rangel ................ | H01L 25/0657 |
| | | | | 257/734 |
| 2008/0265399 | A1 * | 10/2008 | Chao ................. | H01L 23/49827 |
| | | | | 257/698 |
| 2009/0039527 | A1 * | 2/2009 | Chan ..................... | H10F 39/804 |
| | | | | 257/E23.141 |
| 2010/0140805 | A1 * | 6/2010 | Chang ..................... | H10P 72/74 |
| | | | | 257/E21.538 |
| 2012/0028412 | A1 * | 2/2012 | Jeong ................ | H01L 21/76898 |
| | | | | 257/E21.597 |

| | | | | |
|---|---|---|---|---|
| 2012/0038045 | A1 * | 2/2012 | Lee ..................... | H01L 23/3107 |
| | | | | 257/737 |
| 2012/0088332 | A1 * | 4/2012 | Lee ..................... | H10W 74/014 |
| | | | | 257/E21.499 |
| 2013/0099349 | A1 | 4/2013 | Nomachi | |
| 2013/0147036 | A1 * | 6/2013 | Choi ................... | H10P 72/7402 |
| | | | | 257/737 |
| 2013/0154074 | A1 * | 6/2013 | Oh .......................... | H01L 25/50 |
| | | | | 257/676 |
| 2014/0134798 | A1 * | 5/2014 | Kim ....................... | H01L 25/50 |
| | | | | 438/109 |
| 2014/0252562 | A1 * | 9/2014 | Kirby .................. | H01L 25/0657 |
| | | | | 257/621 |
| 2014/0291854 | A1 * | 10/2014 | Lee ..................... | H01L 25/0657 |
| | | | | 257/774 |
| 2014/0327150 | A1 * | 11/2014 | Jung ................... | H10W 20/023 |
| | | | | 257/774 |
| 2015/0048496 | A1 * | 2/2015 | Chiu ....................... | H10P 72/74 |
| | | | | 257/737 |
| 2015/0162265 | A1 * | 6/2015 | Jo ........................... | H01L 24/97 |
| | | | | 257/774 |
| 2015/0179560 | A1 | 6/2015 | Arisaka et al. | |
| 2017/0040293 | A1 * | 2/2017 | Kim ................... | H01L 25/0657 |
| 2017/0103954 | A1 * | 4/2017 | Wu ................... | H01L 23/562 |
| 2017/0110388 | A1 * | 4/2017 | Park ................... | H01L 23/481 |
| 2017/0263545 | A1 | 9/2017 | Tsukamoto et al. | |
| 2017/0330862 | A1 * | 11/2017 | Choe .................... | H01L 23/481 |
| 2018/0012866 | A1 * | 1/2018 | Choi ................... | H01L 25/0657 |
| 2018/0166420 | A1 * | 6/2018 | Park ................... | H01L 25/0657 |
| 2019/0103332 | A1 * | 4/2019 | Liu ................... | H01L 23/3107 |
| 2019/0206844 | A1 * | 7/2019 | Lee ................... | H01L 25/0657 |
| 2019/0221520 | A1 * | 7/2019 | Kim ................... | H01L 25/0657 |
| 2019/0229091 | A1 * | 7/2019 | Kim ................... | H01L 25/0657 |
| 2020/0098719 | A1 * | 3/2020 | Park ................... | H01L 21/563 |
| 2020/0161277 | A1 * | 5/2020 | Lee ................... | H10W 20/023 |
| 2020/0312760 | A1 * | 10/2020 | Park ................... | H10W 70/611 |
| 2021/0066251 | A1 * | 3/2021 | Kim ................... | H01L 23/3135 |
| 2021/0104483 | A1 * | 4/2021 | Park ................... | H01L 25/0657 |
| 2021/0111160 | A1 * | 4/2021 | Kim ................... | H10W 74/141 |
| 2021/0118803 | A1 * | 4/2021 | Park ................... | H10W 70/611 |
| 2021/0134761 | A1 * | 5/2021 | Oh .......................... | H01L 25/18 |
| 2021/0143116 | A1 * | 5/2021 | Hong ................ | H01L 25/0657 |
| 2021/0159178 | A1 * | 5/2021 | Nam ................... | H01L 25/0657 |
| 2021/0183816 | A1 * | 6/2021 | Jun ................... | H01L 25/0657 |
| 2021/0305190 | A1 * | 9/2021 | Choi .................... | H01L 23/562 |
| 2021/0305226 | A1 * | 9/2021 | Tsai ....................... | H10P 72/74 |
| 2021/0335743 | A1 * | 10/2021 | Lee ................... | H01L 23/3157 |
| 2021/0343613 | A1 * | 11/2021 | Ko .......................... | H10P 54/00 |
| 2021/0343616 | A1 * | 11/2021 | Choi .................. | H01L 23/5384 |

FOREIGN PATENT DOCUMENTS

| | | | | |
|---|---|---|---|---|
| CN | 104637870 | A | 5/2015 | |
| CN | 106816426 | A | 6/2017 | |
| CN | 107799494 | A | 3/2018 | |
| JP | 2009060144 | A | 3/2009 | |
| JP | 2013089816 | A | 5/2013 | |
| JP | 2014003081 | A | 1/2014 | |
| KR | 20170094026 | A | * 8/2017 | ........... H01L 23/481 |

OTHER PUBLICATIONS

PCT International Search Report issued in corresponding application No. PCT/CN2021/079317, dated Jun. 7, 2021.

PCT Written Opinion issued in corresponding application No. PCT/CN2021/079317, dated Jun. 7, 2021.

Chinese Office Action issued in corresponding application No. 202010426007.5, dated Nov. 3, 2021.

* cited by examiner

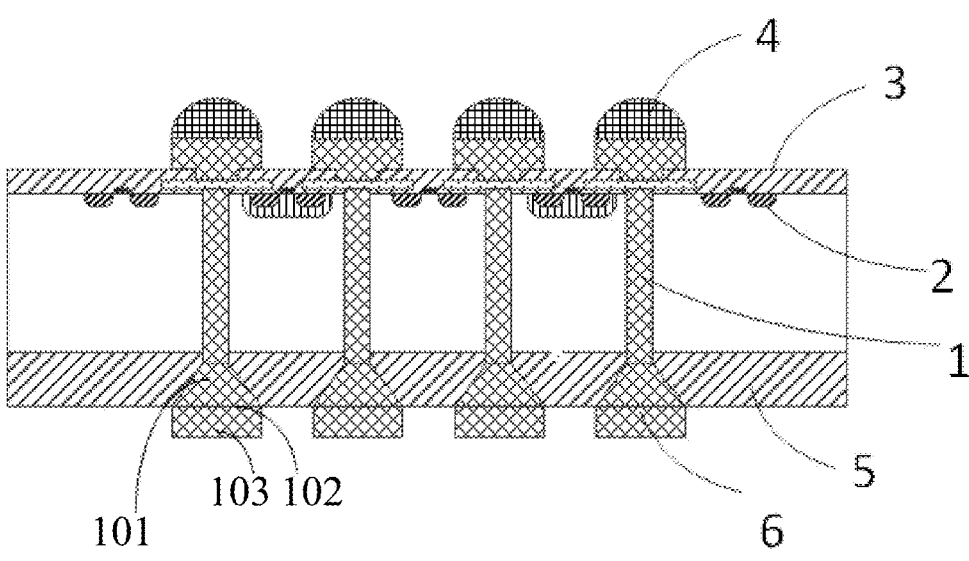

FIG. 1

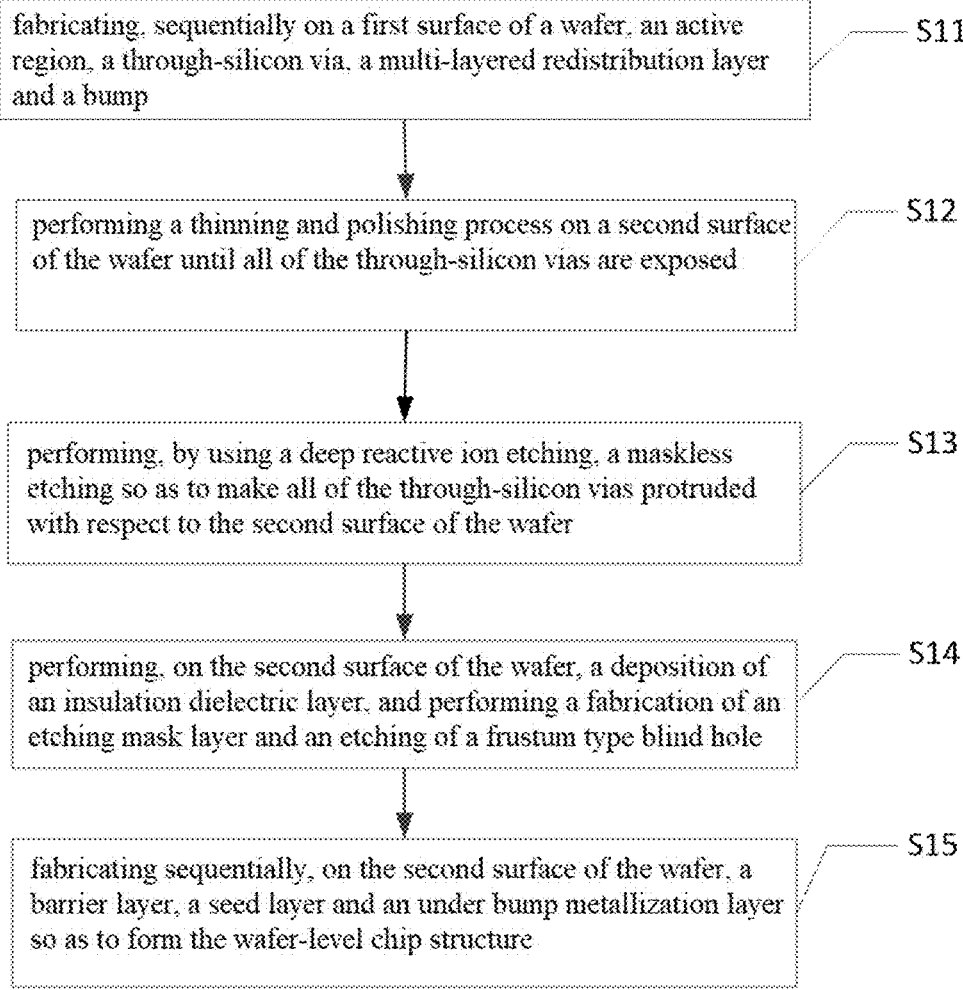

fabricating, sequentially on a first surface of a wafer, an active region, a through-silicon via, a multi-layered redistribution layer and a bump — S11 performing a thinning and polishing process on a second surface of the wafer until all of the through-silicon vias are exposed — S12 performing, by using a deep reactive ion etching, a maskless etching so as to make all of the through-silicon vias protruded with respect to the second surface of the wafer — S13 performing, on the second surface of the wafer, a deposition of an insulation dielectric layer, and performing a fabrication of an etching mask layer and an etching of a frustum type blind hole — S14 fabricating sequentially, on the second surface of the wafer, a barrier layer, a seed layer and an under bump metallization layer so as to form the wafer-level chip structure — S15

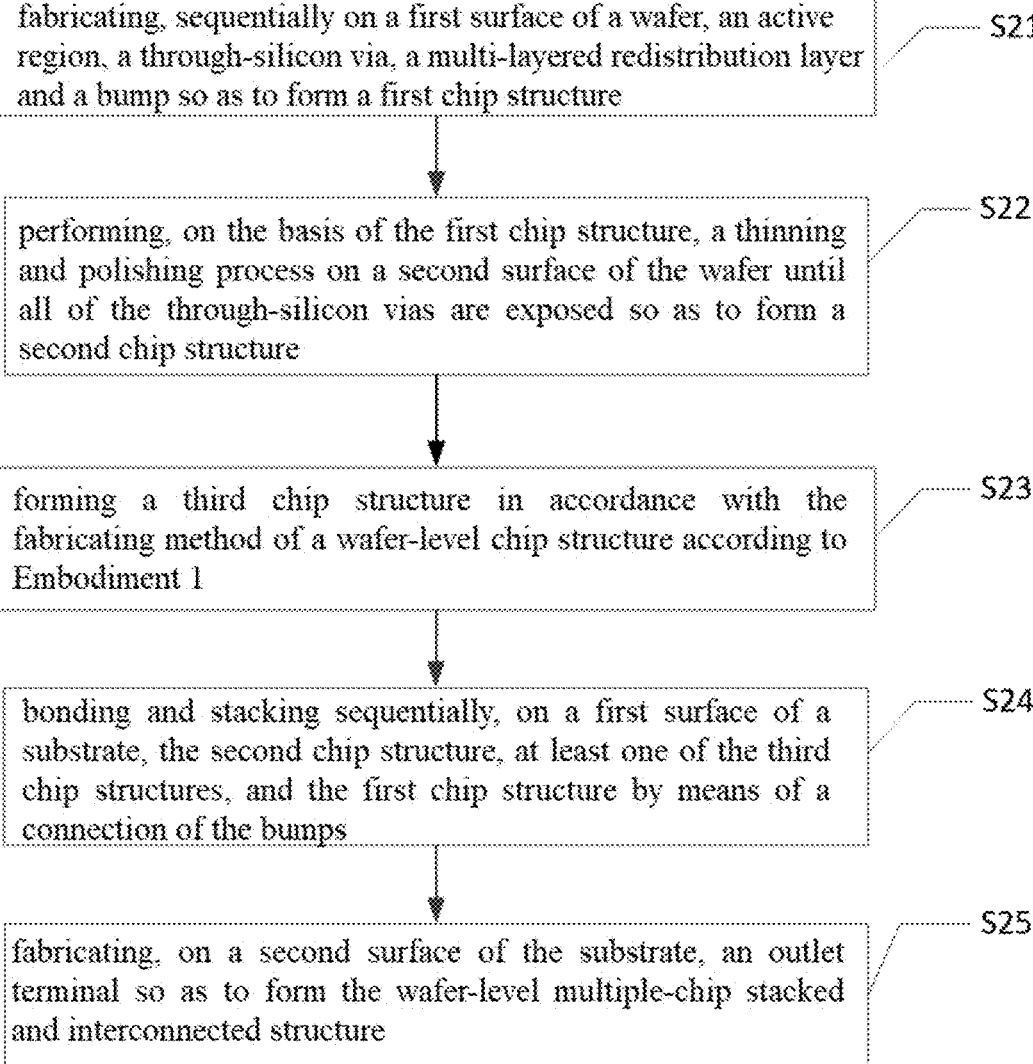

fabricating, sequentially on a first surface of a wafer, an active region, a through-silicon via, a multi-layered redistribution layer and a bump so as to form a first chip structure — S21 performing, on the basis of the first chip structure, a thinning and polishing process on a second surface of the wafer until all of the through-silicon vias are exposed so as to form a second chip structure — S22 forming a third chip structure in accordance with the fabricating method of a wafer-level chip structure according to Embodiment 1 — S23 bonding and stacking sequentially, on a first surface of a substrate, the second chip structure, at least one of the third chip structures, and the first chip structure by means of a connection of the bumps — S24 fabricating, on a second surface of the substrate, an outlet terminal so as to form the wafer-level multiple-chip stacked and interconnected structure — S25

FIG. 11

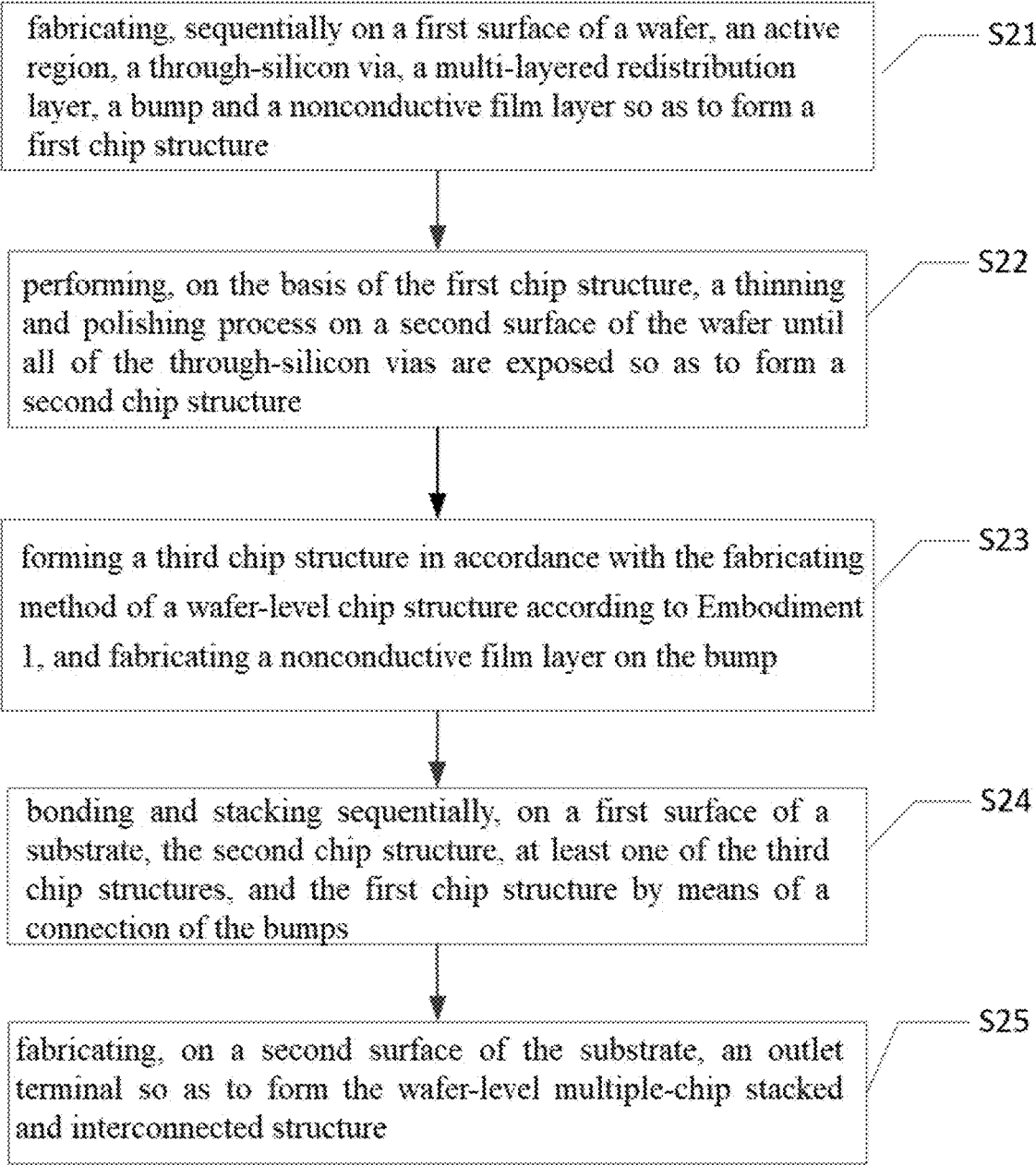

fabricating, sequentially on a first surface of a wafer, an active region, a through-silicon via, a multi-layered redistribution layer, a bump and a nonconductive film layer so as to form a first chip structure — S21 performing, on the basis of the first chip structure, a thinning and polishing process on a second surface of the wafer until all of the through-silicon vias are exposed so as to form a second chip structure — S22 forming a third chip structure in accordance with the fabricating method of a wafer-level chip structure according to Embodiment 1, and fabricating a nonconductive film layer on the bump — S23 bonding and stacking sequentially, on a first surface of a substrate, the second chip structure, at least one of the third chip structures, and the first chip structure by means of a connection of the bumps — S24 fabricating, on a second surface of the substrate, an outlet terminal so as to form the wafer-level multiple-chip stacked and interconnected structure — S25

FIG. 12

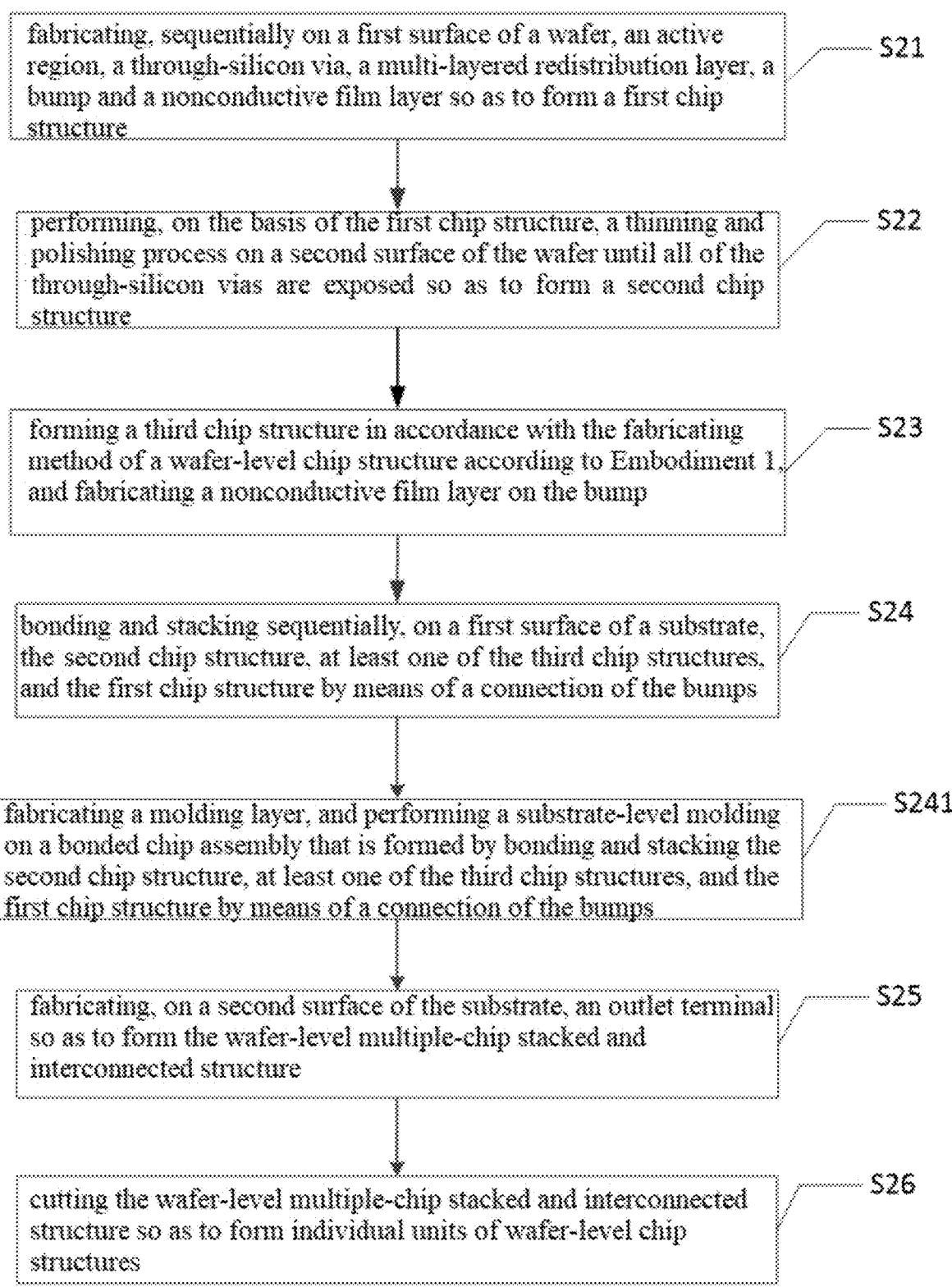

fabricating, sequentially on a first surface of a wafer, an active region, a through-silicon via, a multi-layered redistribution layer, a bump and a nonconductive film layer so as to form a first chip structure — S21 performing, on the basis of the first chip structure, a thinning and polishing process on a second surface of the wafer until all of the through-silicon vias are exposed so as to form a second chip structure — S22 forming a third chip structure in accordance with the fabricating method of a wafer-level chip structure according to Embodiment 1 and fabricating a nonconductive film layer on the bump — S23 bonding and stacking sequentially, on a first surface of a substrate, the second chip structure, at least one of the third chip structures, and the first chip structure by means of a connection of the bumps — S24 fabricating a molding layer, and performing a substrate-level molding on a bonded chip assembly that is formed by bonding and stacking the second chip structure, at least one of the third chip structures, and the first chip structure by means of a connection of the bumps — S241 fabricating, on a second surface of the substrate, an outlet terminal so as to form the wafer-level multiple-chip stacked and interconnected structure — S25 cutting the wafer-level multiple-chip stacked and interconnected structure so as to form individual units of wafer-level chip structures — S26

FIG. 13

WAFER-LEVEL CHIP STRUCTURE, MULTIPLE-CHIP STACKED AND INTERCONNECTED STRUCTURE AND FABRICATING METHOD THEREOF

TECHNICAL FIELD

The present application relates to the field of semiconductor packaging technology, specifically relates to a wafer-level chip structure, a multiple-chip stacked and interconnected structure and a fabricating method thereof.

BACKGROUND

In recent years, in the application of multi-layer chip 3D stacking using a through-silicon via (TSV) and micro-bumps, the electrical signal transmission path between the upper and lower stacked chip layers is as follows: a redistribution layer (RDL) of the upper chip layer, a vertical interconnection (TSV) embedded in the upper chip layer, micro-bumps bonded between the upper and lower chips, an under bump metallization (UBM) of the lower chip layer, a vertical interconnection (TSV) embedded in the lower chip layer, and a redistribution layer (RDL) of the lower chip layer. In the signal transmission path, the impedance of the transmission line is constantly changing, and the change and fluctuation of the impedance would have a significant impact on the transmission quality of the signal, such as the reduction of the opening width of the eye diagram of high bit-rate signals, the increase of transmission noise, and even the distortion on signal, etc.

At present, as applications such as high-performance computing application, AI application, 5G application have higher and higher requirements for storage bandwidth, the high bandwidth memory (HBM) module structure implemented by adopting vertical stacking of multi-layered DRAMs is increasingly becoming a mainstream solution. However, all the current solutions provided by mainstream suppliers in the field adopt the way of directly interconnecting the TSV exposed area on the backside of the DRAM stacking layer to the UBM (under bumping metallization) layer. Considering that the diameter of the TSV is about 6 μm while the diameter of the UBM is about 20~30 μm, when the two are directly interconnected, the impedance shows an abrupt change. Additionally, as the diameter of the TSV gets smaller and the UBM is limited by the difficulty of reducing the diameter of a eutectic bump as well as the pitch (the distance between centers of adjacent bumps), the impedance mismatch between the two would become greater, thereby significantly adversely affecting the transmission quality of high bit-rate signals.

SUMMARY OF THE INVENTION

Therefore, the present application provides a wafer-level chip structure, a multiple-chip stacked and interconnected structure and a fabricating method thereof so as to overcome the defect in the related art that, in the case of 3D chip packaging or wafer-level packaging, the impedance in the transmission path of the signal is continuously changing, and thereby would lead to a significant impact on the quality of signal transmission.

According to a first aspect, the present application provides a wafer-level chip structure that includes:

a through-silicon via, which penetrates a wafer;
a first surface including an active region, a multi-layered redistribution layer and a bump; and a second surface including an insulation dielectric layer, and a frustum transition structure connected with the through-silicon via.

In an embodiment, a diameter of one end opening of the frustum transition structure is determined according to a size of the through-silicon via connected to the frustum transition structure while a diameter of the other end opening thereof is determined according to a size of the bump which is for bonding.

According to a second aspect, embodiments of the present application provide a wafer-level multiple-chip stacked and interconnected structure that includes a bonded chip assembly, a substrate and an outlet terminal. The bonded chip assembly is attached to a first surface of the substrate and the outlet terminal is formed on a second surface of the substrate.

The bonded chip assembly includes a plurality of single wafer-level chips that are stacked up. The plurality of single wafer-level chips are connected directly by bonding layers. The single wafer-level chips include one first chip structure, one second chip structure and at least one third chip structure. The first chip structure and the second chip structure are respectively disposed at opposite sides of the bonded chip assembly, and the at least one third chip structure is disposed between the first chip structure and the second chip structure.

The third chip structure is the wafer-level chip structure according to the first aspect.

In an embodiment, the first chip structure includes:
a through-silicon via which incompletely penetrates a wafer;
a first surface including an active region, a multi-layered redistribution layer and a bump; and
a second surface that is a wafer surface.
the second chip structure includes:
a through-silicon via, which penetrates a wafer;
a first surface including an active region, a multi-layered redistribution layer and a bump; and
a second surface that is a wafer surface having a plurality of the through-silicon vias therein.

In an embodiment, the first surfaces of the first chip structure, the second chip structure and the third chip structure each include a nonconductive film layer that covers the bump. A thickness of the nonconductive film layer is greater than a height of the bump.

The bonding layer includes a connection of the bumps between the single wafer-level chips, and the nonconductive film layer covering the connection of the bumps.

In an embodiment, the wafer-level multiple-chip stacked and interconnected structure further includes:
a molding layer that covers the bonded chip assembly on a substrate level.

According to a third aspect, embodiments of the present application provide a fabricating method of a wafer-level chip structure, which includes:

fabricating, sequentially on a first surface of a wafer, an active region, a through-silicon via, a multi-layered redistribution layer and a bump;

performing a thinning and polishing process on a second surface of the wafer until all of the through-silicon vias are exposed;

performing, by using a deep reactive ion etching, a maskless etching so as to make all of the through-silicon vias protruded with respect to the second surface of the wafer;

performing, on the second surface of the wafer, a deposition of an insulation dielectric layer, and performing a fabrication of an etching mask layer and an etching of a frustum type blind hole; and fabricating sequentially, on the second surface of the wafer, a barrier layer, a seed layer and an under bump metallization layer so as to form the wafer-level chip structure.

According to a fourth aspect, embodiments of the present application provide a fabricating method of a wafer-level multiple-chip stacked and interconnected structure, which includes:

fabricating, sequentially on a first surface of a wafer, an active region, a through-silicon via, a multi-layered redistribution layer and a bump so as to form a first chip structure;

performing, on the basis of the first chip structure, a thinning and polishing process on a second surface of the wafer until all of the through-silicon vias are exposed so as to form a second chip structure;

forming a third chip structure in accordance with the fabricating method of a wafer-level chip structure according to the third aspect;

bonding and stacking sequentially, on a first surface of a substrate, the second chip structure, at least one of the third chip structures, and the first chip structure by means of a connection of the bumps;

fabricating, on a second surface of the substrate, an outlet terminal so as to form the wafer-level multiple-chip stacked and interconnected structure.

In an embodiment, when fabricating the first chip structure and the second chip structure, after the fabricating, sequentially on a first surface of a wafer, an active region, a through-silicon via, a multi-layered redistribution layer and a bump, the method may further include: fabricating a nonconductive film layer that covers the bump, a thickness of the nonconductive film layer being greater than a height of the bump; and after the forming the third chip structure, the method may further include fabricating a nonconductive film layer that covers the bump, a thickness of the nonconductive film layer being greater than a height of the bump.

In an embodiment, after the bonding and stacking, on a first surface of a substrate, the second chip structure, at least one of the third chip structures, and the first chip structure by means of a connection of the bumps, the method may further include fabricating a molding layer, and performing a substrate-level molding on a bonded chip assembly that is formed by bonding and stacking the second chip structure, at least one of the third chip structures, and the first chip structure by means of a connection of the bumps.

In an embodiment, after the fabricating, on a second surface of the substrate, an outlet terminal, the method may further include: cutting the wafer-level multiple-chip stacked and interconnected structure so as to form individual units of wafer-level chip structures.

1, In the wafer-level chip structure and the fabricating method thereof that are provided by the present application, a frustum type impedance transition structure is introduced into a position between a TSV exposed area on a backside of a wafer and a UBM so as to implement an impedance matching between TSV and UBM, thereby alleviating the problem of signal distortion that is caused by an abrupt change of impedance. In order to implement the frustum type transition structure of the solution of the present application, compared to the conventional solution, all that is needed is to add one step of photolithography and one step of reactive ion etching on the basis of the existing process, in which the quantity of photomasks is not increased, and hence the process flow is not complicated.

2, In the wafer-level multiple-chip stacked and interconnected structure and the fabricating method thereof that are provided by the present application, single wafer-level chips having various structures are stacked and bonded, and a frustum type impedance transition structure is introduced into the transition area of bonding between various chips, thereby alleviating the problem of signal distortion that is caused by an abrupt change of impedance. A nonconductive film layer is introduced into the bonding layer, thereby being able to prevent the occurrence of bump bridging when single wafer-level chips are being stacked and bonded.

BRIEF DESCRIPTION OF THE DRAWINGS

For more clearly describing the technical solutions in detailed embodiments of the present application or in the related art, the accompanying drawings, which are needed for describing the detailed embodiments or the related art, will be briefly introduced hereinafter, Apparently, the accompanying drawings described below refer to some embodiments of the present application, and other drawings can be acquired on the basis of the accompanying drawings illustrated herein, by those skilled in the art without making any creative effort.

FIG. 1 is a schematic diagram of a specific example of a wafer-level chip structure that is provided by an embodiment of the present application.

FIG. 2 is a flowchart of a specific example of a fabricating method of a wafer-level chip structure provided by an embodiment of the present application.

FIG. 11 is a flowchart of a specific example of a fabricating method of a wafer-level multiple-chip stacked and interconnected structure, which is provided by an embodiment of the present application.

FIG. 12 is a flowchart of another specific example of a fabricating method of a wafer-level multiple-chip stacked and interconnected structure, which is provided by an embodiment of the present application.

FIG. 13 is a flowchart of yet another specific example of a fabricating method of a wafer-level multiple-chip stacked and interconnected structure, which is provided by an embodiment of the present application.

DETAILED DESCRIPTION OF EMBODIMENTS

Figure 3:
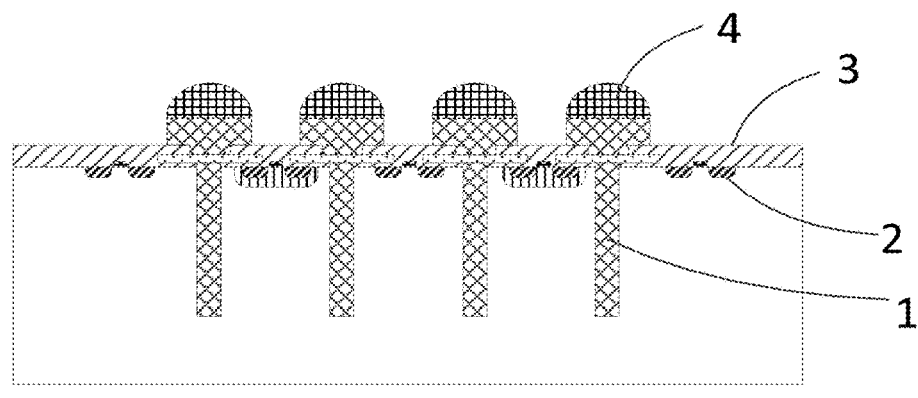
FIG. 3 is a structural schematic diagram of a sequential fabrication of an active region, a through-silicon via, a multi-layered redistribution layer and a bump on a first surface of a wafer, which is provided by an embodiment of the present application.

A description of technical solutions of the present application will be presented in a clear and complete fashion hereinafter by reference to the accompanying drawings. Apparently, the embodiments described herein are not all but some of the embodiments of the present application. Any other embodiment that can be acquired, on the basis of the embodiments described in the present application, by those skilled in the art without making any creative effort, shall be encompassed within the scope of protection of the present application.

In the description of the present application, it should be noted that, unless otherwise specified or limited, the terms "installed", "connected", "coupled" or the like should be broadly understood, for instance, it may be a fixed connection, a detachable connection or an integral connection, may be a mechanical connection or an electrical connection, may be a direct connection or an indirect connection via an intermediate medium, or otherwise may be an interior communication between two elements, and may be a wireless connection or a wired connection. For those skilled in the art, specific meanings of the above terms in the present application can be understood according to the specific circumstances thereof.

Moreover, technical features involved in different embodiments of the present application described hereinafter can be combined with one another, unless mutually contradicted.

Embodiment 1

Provided by an embodiment of the present application is a wafer-level chip structure, which, as shown in FIG. 1, includes: a through-silicon via 1, which penetrates a wafer; a first surface including an active region 2, a multi-layered redistribution layer 3 and a bump 4; and a second surface including an insulation dielectric layer 5, and a frustum transition structure 6 connected with the through-silicon via.

In an embodiment of the present application, a material filled inside the through-silicon via 1 may be copper. The bump 4 may be a tin solder ball. The diameter of one end opening of the frustum transition structure 6 may be determined according to the size of the through-silicon via connected to the frustum transition structure while the diameter of the other end opening thereof may be determined according to the size of the bump which is for bonding. The frustum transition structure may be implemented on the basis of an inductively coupled plasma reactive ion etching process that uses a processing gas, such as $SF_6/CF_4/CHF_3/O_2/Ar$, etc., and the produced frustum transition structure may have a height of approximately 2~6 μm (there are the limitations by the depth of deposition of $SiO_2$, as well as by the stress in a thin film, i.e. the greater the depth, the greater the wafer warpage and the higher the risk of peeling of the thin film). A lower opening of the frustum may be the same as or greater, in some degree, than the through-silicon via connected thereto in size (there are the limitations by the accuracy in overlay and photolithography, as well as by the diameter/slope of the opening of the frustum). The diameter of an upper opening of the frustum transition structure may be determined according to the size of the bump which is for bonding (in practice, the upper opening of the frustum has the same diameter as a to-be-bonded under bump metallization (a to-be-bonded UBM), and the to-be-bonded UBM is used in combination with a to-be-bonded micro-bump, and typically, the to-be-bonded UBM and the to-be-bonded micro-bump have the same diameter, or otherwise the UBM may be designed to has a slightly greater diameter than the micro-bump). The slope of the frustum may be optimized by adjusting parameters of the $SiO_2$-RIE (reactive ion etching) etching process, and the range of adjustment is relatively large. After the etching of the frustum transition structure is completed, the complete copper filling into the frustum structure may be implemented by a process of electroplating which is a mature process and is of relatively low difficulty.

Figure 4:
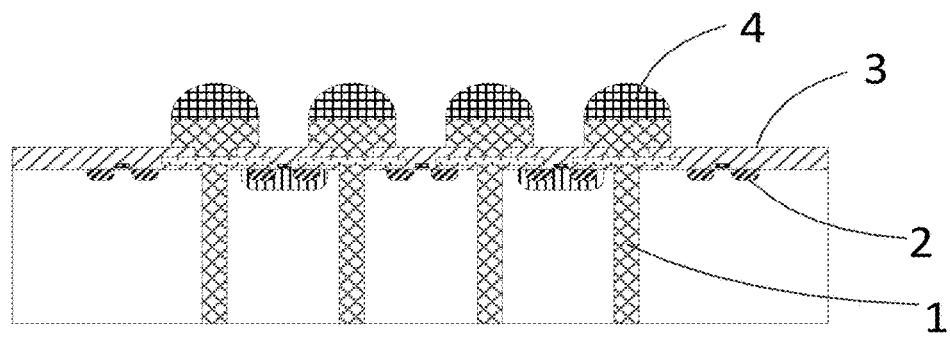
FIG. 4 is a structural schematic diagram of a performance of a thinning and polishing process on a second surface of the wafer until all through-silicon vias are exposed, which is provided by an embodiment of the present application.
Figure 5:
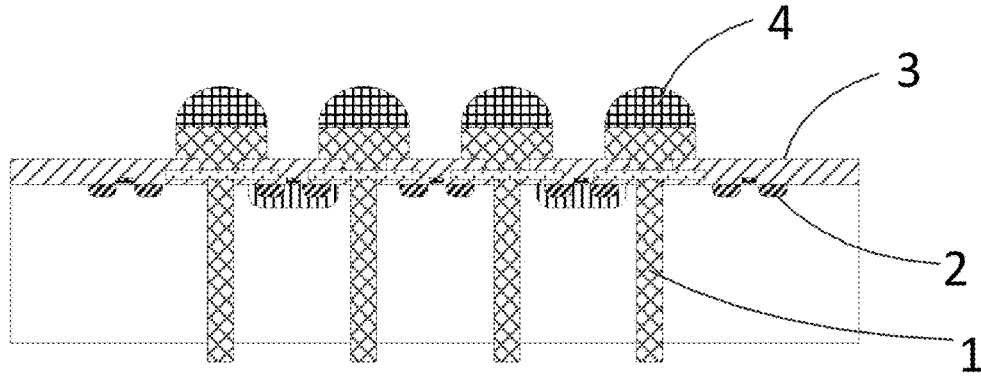
FIG. 5 is a structural schematic diagram of a through-silicon via that protrudes entirely with respect to a second surface of a wafer, which is provided by an embodiment of the present application.
Figure 6:
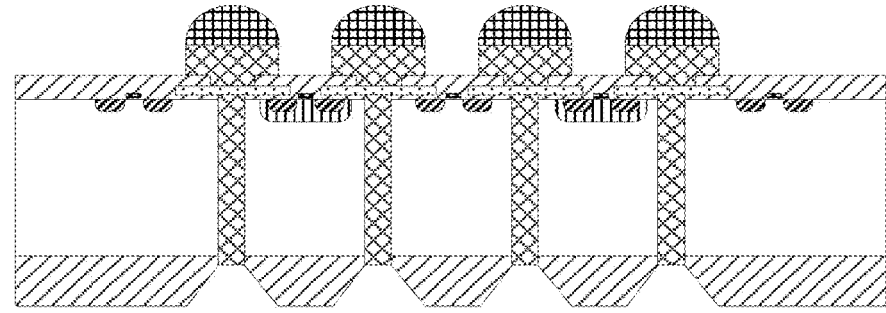
FIG. 6 is a schematic diagram of a performance of a deposition of an insulation dielectric layer on a second surface of a wafer, a fabrication of an etching mask layer and an etching of a frustum type blind hole, which is provided by an embodiment of the present application.

Further provided by an embodiment of the present application is the fabricating method of a wafer-level chip structure, which, as shown in FIG. 2, includes:

Step S11 of fabricating, sequentially on a first surface of a wafer, an active region, a through-silicon via, a multi-layered redistribution layer and a bump, wherein the fabricating process of this step may use a mature fabricating technique, however the present application is not limited hereto, and wherein the structure formed herein may be as shown in FIG. 3;

Step S12 of performing a thinning and polishing process on a second surface of the wafer until all of the through-silicon vias are exposed, wherein the fabricating process of this step may use a mature fabricating technique, however the present application is not limited hereto, and wherein the structure formed herein may be as shown in FIG. 4;

Step S13 of performing, by using a deep reactive ion etching, a maskless etching so as to make all of the through-silicon vias protruded with respect to the second surface of the wafer, wherein a deep reactive ion etching may be used to perform a maskless etching, i.e. an "etch-back", on a backside of the wafer so as to cause the through-silicon via (TSV) to protrude entirely with respect to the backside of the wafer, and wherein the structure formed herein may be as shown in FIG. 5;

Step S14 of performing, on the second surface of the wafer, a deposition of an insulation dielectric layer, and performing a fabrication of an etching mask layer and an etching of a frustum type blind hole, wherein a low-temperature $SiO_x$ deposition process may be used to perform the deposition of a $SiO_x$ insulation dielectric layer on the backside of the wafer, and then a fabrication of an etching mask layer and an etching of a "frustum" type blind hole may be sequentially performed by means of a process of photolithography, and wherein the structure formed herein may be as shown in FIG. 6; and Step S15 of fabricating sequentially, on the second surface of the wafer, a barrier layer 101, a seed layer 102 and an under bump metallization layer 103 so as to form the wafer-level chip structure, wherein, on the backside of the wafer, after depositions of a barrier layer 101 and a seed layer 102 (a barrier/seed layer 102) are sequentially completed and a UBM electroplating mask is fabricated by using a process of photolithography, a fabricating of the UBM by electroplating may be performed, then a removal of the mask for electroplating may be performed by wet stripping, and then removals of the seed layer 102 and the barrier layer 101 may be sequentially performed by wet etching, finally a ENIG (electroless nickel immersion gold) surface finish may be performed on the surface of the UBM, and wherein after the process of the ENIG surface finish, nickel (Ni, which typically has a thickness of 2 to 3 um) and aurum (Au, which typically has a thickness of 50 nm) may be sequentially deposited on the copper of the UBM. A function of the layer of nickel is to prevent the metallic copper of a copper wire or a copper pad from forming an alloy with the metallic tin when a tin solder ball backflows, which may lead to a problem of reliability failure.

In the wafer-level chip structures and the fabricating methods thereof that are provided by the embodiments of the present application, a frustum type impedance transition structure is introduced into a position between a TSV exposed area on a backside of a wafer and a UBM so as to implement an impedance matching between TSV and UBM, thereby alleviating the problem of signal distortion that is caused by an abrupt change of impedance. In order to implement the frustum type transition structure of the solution of the present application, compared to the conventional solution, all that is needed is to add one step of photolithography and one step of reactive ion etching on the basis of the existing process, in which the quantity of photomasks is not increased, and hence the process flow is not complicated.

Embodiment 2

Figure 7:
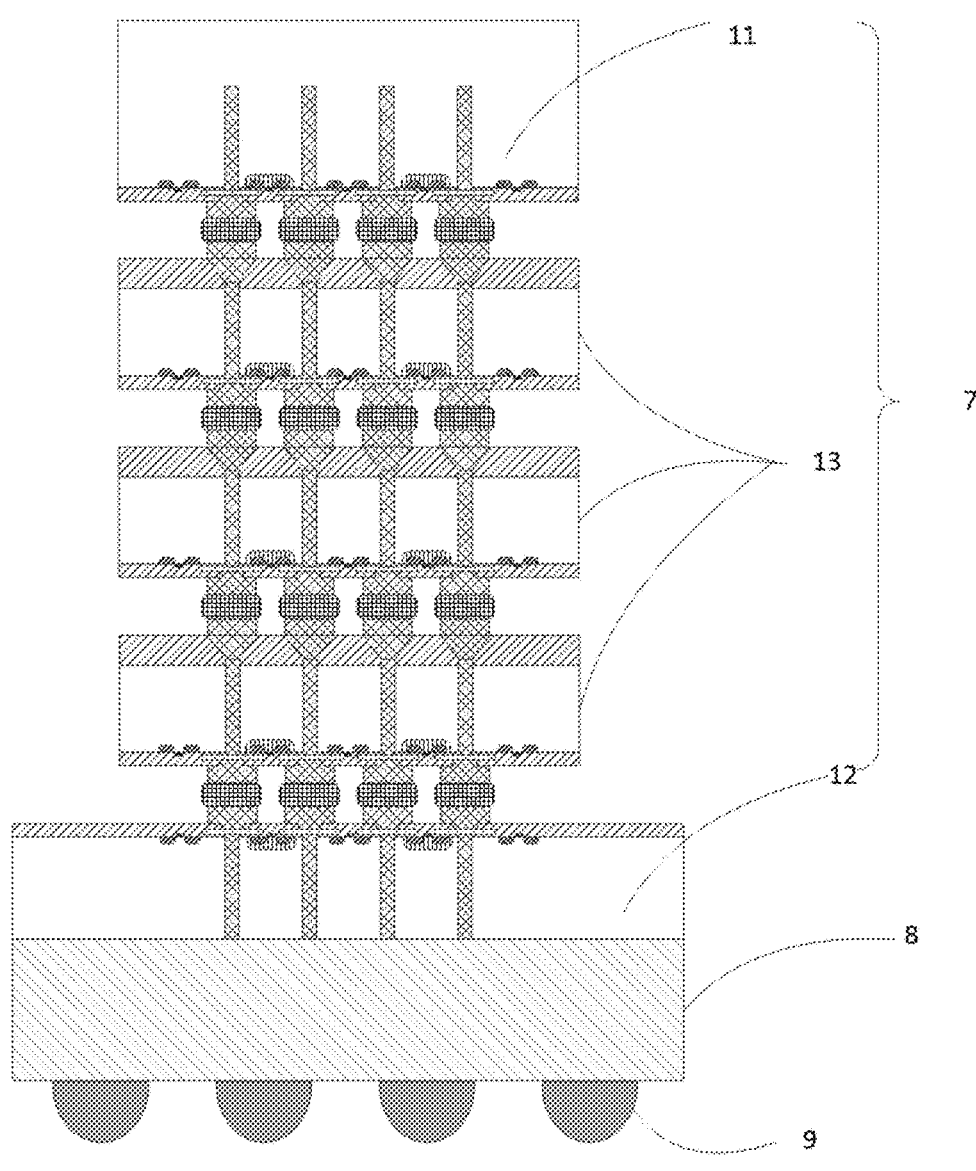
FIG. 7 is a schematic diagram of a wafer-level multiple-chip stacked and interconnected structure that is provided by an embodiment of the present application.

Provided by an embodiment of the present application is a wafer-level multiple-chip stacked and interconnected structure, which, as shown in FIG. 7, includes: a bonded chip assembly 7, a substrate 8 and an outlet terminal 9. The bonded chip assembly 7 is attached to a first surface of the substrate 8, the outlet terminal 9 is formed on a second surface of the substrate.

The bonded chip assembly 7 includes a plurality of single wafer-level chips that are stacked up. The plurality of single wafer-level chips are connected directly by bonding layers. The single wafer-level chips include one first chip structure 11, one second chip structure 12 and at least one third chip structure 13. The first chip structure 11 and the second chip structure 12 are respectively disposed at opposite sides of the bonded chip assembly 7. The at least one third chip structure 13 is disposed between the first chip structure 11 and the second chip structure 12. The third chip structure 13 is the wafer-level chip structure according to EMBODIMENT 1. Shown in FIG. 7 is an example of the bonded chip assembly 7 including the third chip structure 13, however the present application is not limited hereto.

In an embodiment, the first chip structure 11 which, as shown in FIG. 3, includes a through-silicon via which incompletely penetrates a wafer, a first surface including an active region, a multi-layered redistribution layer and a bump, and a second surface that is a wafer surface.

In an embodiment, the second chip structure 12 which, as shown in FIG. 4, includes a through-silicon via which penetrates a wafer, a first surface including an active region, a multi-layered redistribution layer and a bump, and a second surface that is a wafer surface having a plurality of the through-silicon vias therein.

Figure 8:
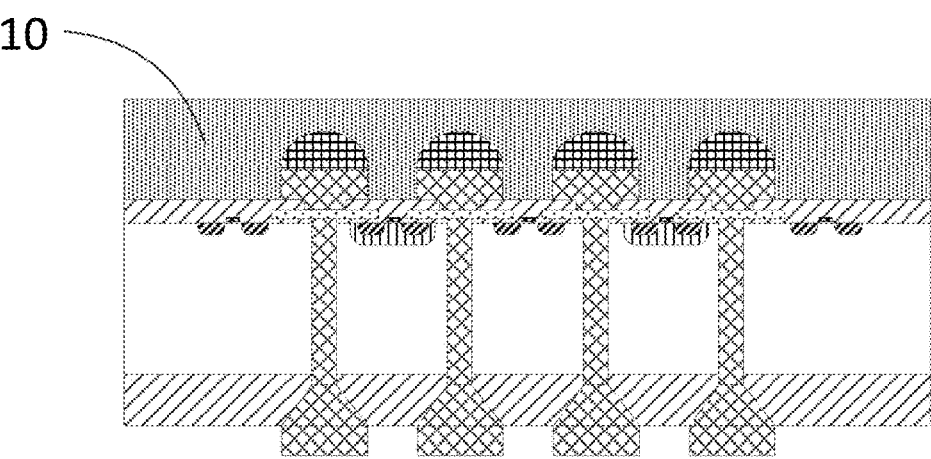
FIG. 8 is a schematic diagram of a formation of the nonconductive film layer on a first surface of a third chip structure, which is provided by an embodiment of the present application.

In an embodiment, the first surfaces of the first chip structure, the second chip structure and the third chip structure each include a nonconductive film layer 10 that covers the bump. A thickness of the nonconductive film layer is greater than a height of the bump. As shown in FIG. 8, taking the third chip structure for example, the first surface of the third chip structure is formed with a nonconductive film (NCF) layer, for instance, Hitachi AK400 series.

Figure 9:
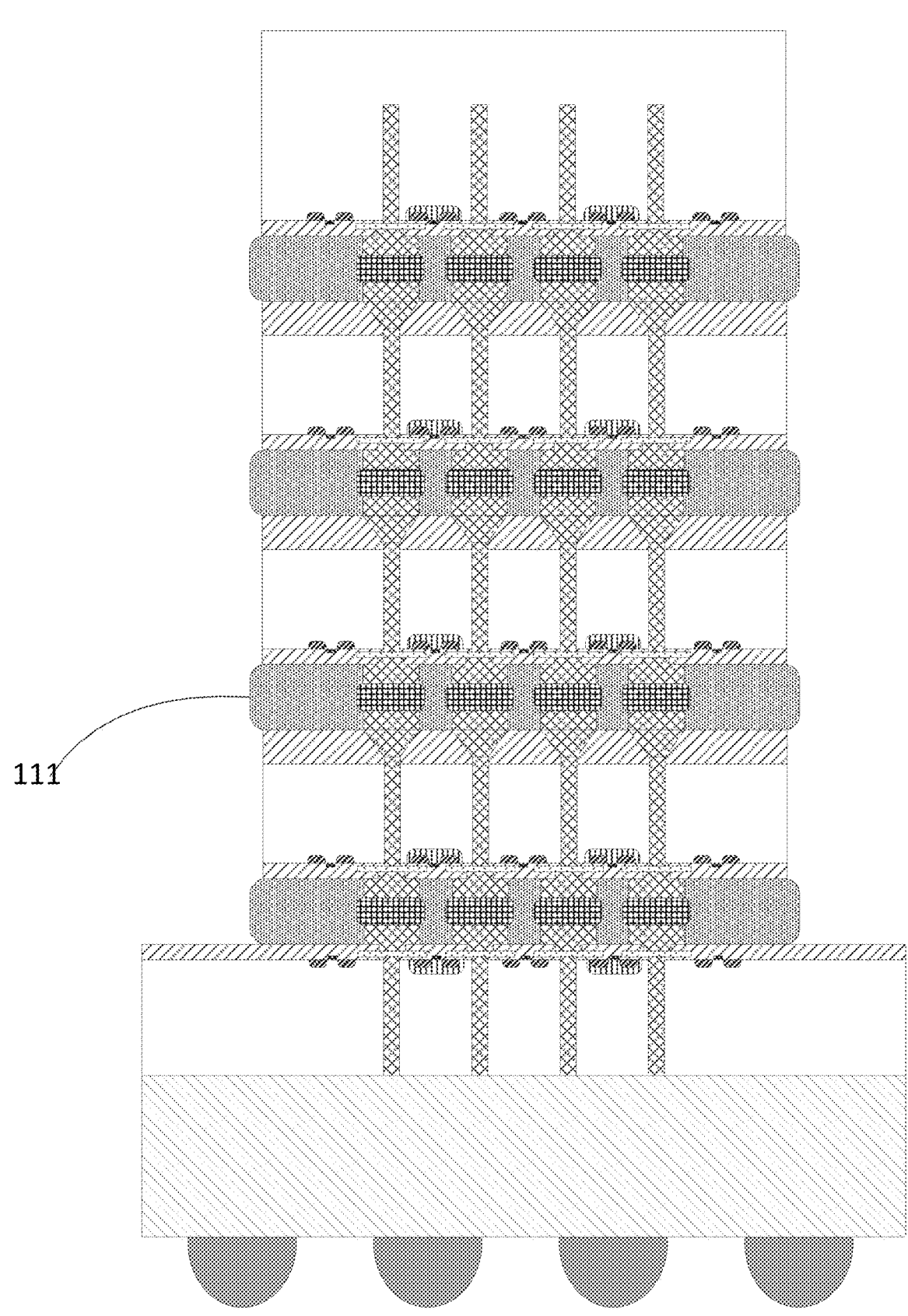
FIG. 9 is a schematic diagram of a bonding layer that is provided by an embodiment of the present application.

As shown in FIG. 9, the bonding layer 111 includes a connection of the bumps between the single wafer-level chips, and the nonconductive film layer covering the connection of the bumps. The occurrence of bump bridging when the single wafer-level chips are being stacked and bonded can be prevented by setting the nonconductive film layer.

Figure 10:
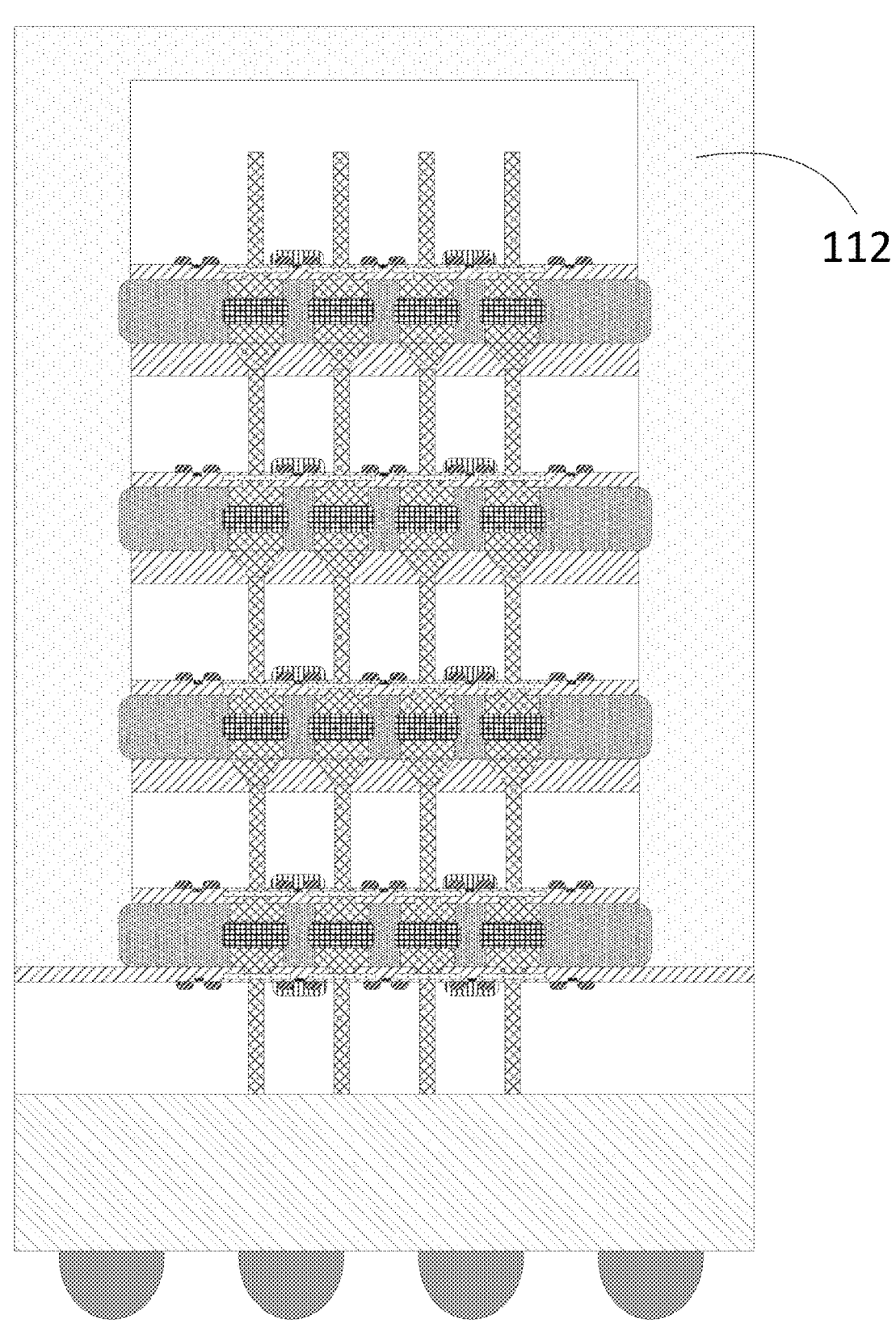
FIG. 10 is a schematic diagram of a molding layer that is provided by an embodiment of the present application.

In an embodiment, as shown in FIG. 10, the wafer-level multiple-chip stacked and interconnected structure may further include a molding layer 112 that covers the bonded chip assembly on a substrate level. Multi-layer-stacked chips are molded by the molding layer, thereby implementing a protection on the chips.

Accordingly, a fabricating method of the wafer-level multiple-chip stacked and interconnected structure is further provided by an embodiment of the present application, which, as shown in FIG. 11, may include:

Step S21 of fabricating, sequentially on a first surface of a wafer, an active region, a through-silicon via, a multi-layered redistribution layer and a bump so as to form a first chip structure;

Step S22 of performing, on the basis of the first chip structure, a thinning and polishing process on a second surface of the wafer until all of the through-silicon vias are exposed so as to form a second chip structure;

Step S23 of forming a third chip structure in accordance with the fabricating method of a wafer-level chip structure according to Embodiment 1, wherein, to be specific, a maskless etching may be performed on the basis of the second chip structure by using a deep reactive ion etching so as to make all of the through-silicon vias protruded with respect to the second surface of the wafer; a deposition of an insulation dielectric layer may be performed on the second surface of the wafer and a fabrication of an etching mask layer and an etching of a frustum type blind hole may be performed; and a barrier layer 101, a seed layer 102 and an under bump metallization layer 103 may be fabricated sequentially on the second surface of the wafer so as to form the third chip structure;

Step S24 of bonding and stacking sequentially, on a first surface of a substrate, the second chip structure, at least one of the third chip structures, and the first chip structure by means of a connection of the bumps, wherein, in an embodiment of the present application, a frustum type impedance transition structure may be introduced into a position between the TSV exposed area on the backside of the wafer of the third chip structure and the UBM so as to implement an impedance matching between TSV and UBM, that is, a frustum type impedance transition structure is introduced into the transition area of the bonding between the respective chips, thereby alleviating the problem of signal distortion that is caused by an abrupt change of impedance; and Step S25 of fabricating, on a second surface of the substrate, an outlet terminal so as to form the wafer-level multiple-chip stacked and interconnected structure, wherein the outlet terminal in the present embodiment may be a tin solder ball which is used for leading out the signal from the interconnected structure.

In an embodiment, as shown in FIG. 12, when fabricating the first chip structure and the second chip structure, after the fabricating, sequentially on a first surface of a wafer, an active region, a through-silicon via, a multi-layered redistribution layer and a bump, the method may further include fabricating a nonconductive film layer that covers the bump, wherein a thickness of the nonconductive film layer may be greater than a height of the bump. After the forming the third chip structure, the method may further include fabricating a nonconductive film layer that covers the bump, wherein a thickness of the nonconductive film layer may be greater than a height of the bump. When bonding the respective chips together, the nonconductive film layer may be melted into liquid by means of heating and compression, and then the chips may be electrically connected by the bumps, thereby preventing the situation of bridging caused by metal splash during bump bonding so as to provide a better bonding result.

As shown in FIG. 13, after the bonding and stacking, on a first surface of a substrate, the second chip structure, at least one of the third chip structures, and the first chip structure by means of a connection of the bumps, the method may further include:

Step S241 of fabricating a molding layer, and performing a substrate-level molding on a bonded chip assembly that is formed by bonding and stacking the second chip structure, at least one of the third chip structures, and the first chip structure by means of a connection of the bumps, wherein a structure as shown in FIG. 10 is formed.

After the fabricating, on a second surface of the substrate, an outlet terminal, the method may further include:

Step S26 of cutting the wafer-level multiple-chip stacked and interconnected structure so as to form individual units of wafer-level chip structures.

In the wafer-level multiple-chip stacked and interconnected structure and the fabricating method thereof that are provided by the present application, single wafer-level chips having various structures are stacked and bonded, and a frustum type impedance transition structure is introduced into the transition area of bonding between various chips, thereby alleviating the problem of signal distortion that is caused by an abrupt change of impedance. A nonconductive film layer is introduced into the bonding layer, thereby being able to prevent the occurrence of bump bridging when the single wafer-level chips are being stacked and bonded.

Apparently, the above-described embodiments are merely exemplary for the purpose of clear illustration rather than restrictive as regards the implementing ways thereof. Other various changes and modifications can be implemented by those skilled in the art on the basis of the above-described illustrations. It is not necessary or possible to exhaustively list all the embodiments. However, any change or modification that can be obviously derived therefrom is encompassed within the protective scope of the present application.

What is claimed is:

1. A wafer-level multiple-chip stacked and interconnected structure, comprising: a bonded chip assembly, a substrate and an outlet terminal, wherein:

the bonded chip assembly is attached to a first surface of the substrate and the outlet terminal is formed on a second surface of the substrate, and wherein:

the bonded chip assembly comprises a plurality of single wafer-level chips that are stacked up, the plurality of single wafer-level chips being connected directly by bonding layers, the single wafer-level chips comprising one first chip structure, one second chip structure and at least one third chip structure, the first chip structure and the second chip structure being respectively disposed at opposite sides of the bonded chip assembly, and the at least one third chip structure being disposed between the first chip structure and the second chip structure;

the third chip structure is a wafer-level chip structure comprising a through-silicon via, which penetrates a wafer; a first surface comprising an active region, a multi-layered redistribution layer and a bump; and a second surface comprising a frustum transition structure connected with the through-silicon via;

the first chip structure comprises a through-silicon via which incompletely penetrates a wafer, a first surface comprising an active region, a multi-layered redistribution layer and a bump, and a second surface that is a wafer surface; and the second chip structure comprises a plurality of through-silicon vias which penetrate a wafer, a first surface comprising an active region, a multi-layered redistribution layer and a bump, and a second surface that is a wafer surface having the plurality of the through-silicon vias therein.

2. The wafer-level multiple-chip stacked and interconnected structure according to claim 1, wherein:

the first surfaces of the first chip structure, the second chip structure and the third chip structure each comprise a nonconductive film layer that covers the bump, a thickness of the nonconductive film layer being greater than a height of the bump; and a first bonding layer comprising a bump-to-bump connection between the bump of the second chip structure and the bump of an adjacent one of the at least one third chip structure, and other bonding layers each comprising a UBM-to-bump connection between an under bump metallization layer of the at least one third chip structure and the bump of either an adjacent one of the at least one third chip structure or the first chip structure, wherein the under bump metallization layer is provided on the second surface of the at least one third chip structure, and the nonconductive film layers cover each of the bump-to-bump connection of the first bonding layer and the UBM-to-bump connection of the other bonding layers.

3. The wafer-level multiple-chip stacked and interconnected structure according to claim 1, further comprising:

a molding layer configured for covering the bonded chip assembly on the substrate.

4. A method for fabricating the wafer-level multiple chip-stacked and interconnected structure of claim 1, comprising:

fabricating, sequentially on a first surface of a wafer, an active region, a plurality of through-silicon vias, a multi-layered redistribution layer and a bump so as to form a first chip structure;

performing, on the basis of the first chip structure, a thinning and polishing process on a second surface of the wafer until all of the through-silicon vias are exposed so as to form a second chip structure;

forming a third chip structure according to the following steps;

fabricating, sequentially on a first surface of a wafer, an active region, a plurality of through-silicon vias, a multi-layered redistribution layer and a bump;

performing a thinning and polishing process on a second surface of the wafer until all of the through-silicon vias are exposed;

performing, by using a deep reactive ion etching, a maskless etching so as to make all of the through-silicon vias protruded with respect to the second surface of the wafer;

performing, on the second surface of the wafer, a deposition of an insulation dielectric layer, and performing a fabrication of an etching mask layer and an etching of a frustum type blind hole;

fabricating sequentially, on the second surface of the wafer, a barrier layer, a seed layer and an under bump metallization layer so as to form the wafer-level chip structure;

bonding and stacking sequentially, on a first surface of a substrate, the second chip structure, at least one third chip structure, and the first chip structure by means of a bump-to-bump connection between the bump of the second chip structure and the bump of the at least one third chip structure, a UBM-to-bump connection between the under bump metallization of the at least one third chip structure and the bump of another one of the at least one third chip structure in the case that there are two or more third chip structures, and at least one UBM-to-bump connection between the under bump metallization of a last to be stacked one of the at least one third chip structure and the bump of the first chip structure; and fabricating, on a second surface of the substrate, an outlet terminal so as to form the wafer-level multiple-chip stacked and interconnected structure.

5. The method of claim 4, wherein when fabricating the first chip structure and the second chip structure, after the fabricating, sequentially on the first surface of each of the wafer of the first chip structure and the wafer of the second chip structure, the active region, the through-silicon vias, the multi-layered redistribution layer and the bump, the method further comprises:

fabricating a nonconductive film layer that covers the bump, a thickness of the nonconductive film layer being greater than a height of the bump; and after the forming the third chip structure, the method further comprises:

fabricating a nonconductive film layer that covers the bump, a thickness of the nonconductive film layer being greater than a height of the bump.

6. The method of claim 4, wherein after the bonding and stacking, on the first surface of the substrate, the second chip structure, at least one third chip structure, and the first chip structure by means of the bump-to-bump connection and the at least one UBM-to-bump connection, the method further comprises:

fabricating a molding layer on the substrate to cover the bonded chip assembly that is formed by bonding and stacking the second chip structure, at least one third chip structure, and the first chip structure by means of the bump-to-bump connection and the at least one UBM-to-bump connection.

7. The method for fabricating a wafer-level multiple-chip stacked and interconnected structure according to claim 6, wherein after the fabricating, on the second surface of the substrate, the outlet terminal, the method further comprises:

cutting the wafer-level multiple-chip stacked and interconnected structure so as to form individual units of wafer-level chip structures.

* * * * *